(12) United States Patent
Sakaue et al.

(10) Patent No.: US 9,312,885 B2
(45) Date of Patent: Apr. 12, 2016

(54) NONVOLATILE SEMICONDUCTOR MEMORY SYSTEM ERROR CORRECTION CAPABILITY OF WHICH IS IMPROVED

(71) Applicants: Kenji Sakaue, Yokohama (JP); Yoshihisa Kondo, Fujisawa (JP); Tarou Iwashiro, Yokohama (JP)

(72) Inventors: Kenji Sakaue, Yokohama (JP); Yoshihisa Kondo, Fujisawa (JP); Tarou Iwashiro, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 37 days.

(21) Appl. No.: 13/671,936

(22) Filed: Nov. 8, 2012

(65) Prior Publication Data

US 2014/0053041 A1  Feb. 20, 2014

Related U.S. Application Data

(60) Provisional application No. 61/683,504, filed on Aug. 15, 2012.

(51) Int. Cl.
| | |
|---|---|
| *H03M 13/03* | (2006.01) |
| *G06F 11/16* | (2006.01) |
| *H03M 13/29* | (2006.01) |
| *G06F 11/10* | (2006.01) |
| *H03M 13/11* | (2006.01) |

(52) U.S. Cl.
CPC ....... *H03M 13/2909* (2013.01); *G06F 11/1044* (2013.01); *H03M 13/293* (2013.01); *H03M 13/2948* (2013.01); *H03M 13/1102* (2013.01)

(58) Field of Classification Search
CPC ............ G11C 29/42; G11C 2211/4062; G06F 11/1096; G06F 11/1044; H03M 13/293; H03M 13/2909; H03M 13/1102; H03M 13/2948

See application file for complete search history.

(56) References Cited

U.S. PATENT DOCUMENTS

| | | | | |
|---|---|---|---|---|
| 2009/0248952 | A1* | 10/2009 | Radke et al. | 711/100 |
| 2010/0313099 | A1* | 12/2010 | Yamaga | 714/755 |
| 2011/0107013 | A1* | 5/2011 | Ho | 711/103 |
| 2011/0191523 | A1* | 8/2011 | Caulkins | 711/103 |
| 2012/0221926 | A1* | 8/2012 | Blaum et al. | 714/770 |
| 2012/0290897 | A1* | 11/2012 | Yoon et al. | 714/766 |
| 2012/0303986 | A1* | 11/2012 | Flynn et al. | 713/320 |

FOREIGN PATENT DOCUMENTS

| | | |
|---|---|---|
| JP | 9-27200 | 1/1997 |
| JP | 9-55077 | 2/1997 |
| JP | 10-97471 | 4/1998 |
| JP | 2004-348824 | 12/2004 |

* cited by examiner

*Primary Examiner* — Albert Decady
*Assistant Examiner* — Kyle Vallecillo
(74) *Attorney, Agent, or Firm* — Oblon, McClelland, Maier & Neustadt, L.L.P.

(57) ABSTRACT

According to one embodiment, a memory system includes a memory cell array, first error correction part, second error correction part, and third error correction part. The memory cell array includes a first storage area in which 1-bit data is stored in one memory cell, and second storage area in which data of a plurality of bits is stored in one memory cell. When data is written to the first storage area, the first error correction part generates first parity data in the row direction on the basis of the data described above. The second error correction part corrects an error of the data described above on the basis of the first parity data read from the memory cell array. The third error correction part generates second parity data in the column direction on the basis of data of a plurality of pages.

10 Claims, 7 Drawing Sheets

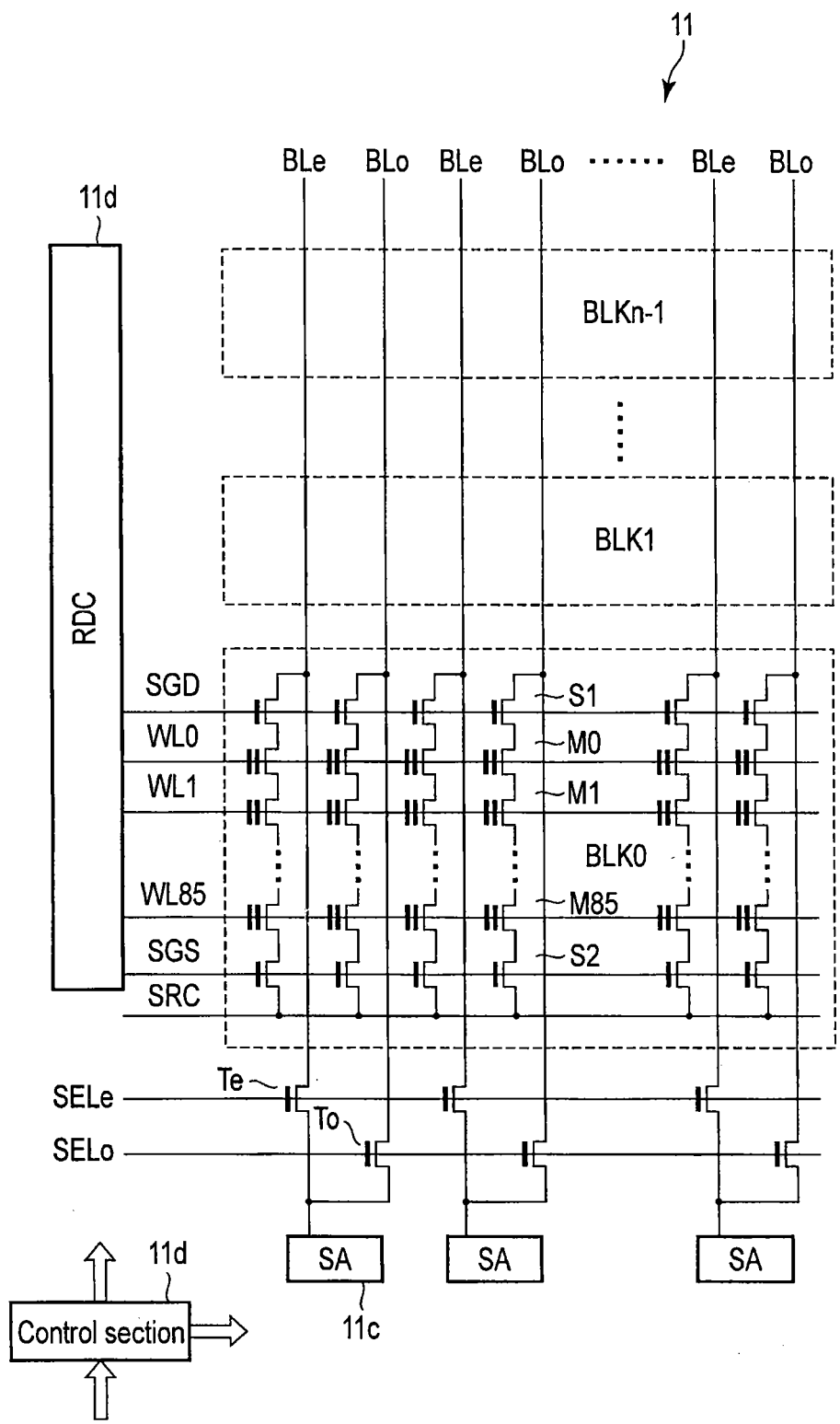
F I G. 2

NONVOLATILE SEMICONDUCTOR MEMORY SYSTEM ERROR CORRECTION CAPABILITY OF WHICH IS IMPROVED

CROSS-REFERENCE TO RELATED APPLICATIONS

This application claims the benefit of U.S. Provisional Application No. 61/683,504, filed Aug. 15, 2012, the entire contents of which are incorporated herein by reference.

FIELD

Embodiments described herein relate generally to a nonvolatile semiconductor memory system such as a NAND flash memory error correction capability of which is improved.

BACKGROUND

In, for example, a NAND flash memory, page addresses are set to a plurality of memory cells simultaneously selected by a word line, and data is accessed in units of pages. Accordingly, when data is to be written to the NAND flash memory, parity data is generated for data in a page, and the parity data is written to a page identical to the data. Further, when data is to be read from the NAND flash memory, the parity data is read together with the data in the page, and an error of the data can be corrected by using the parity data. In this way, the user data and parity data are managed in the page, and hence the parity area which can be secured in the page is limited, whereby the error correction capability is restrained. Accordingly, improvement in the error correction capability of the NAND flash memory is desired.

BRIEF DESCRIPTION OF THE DRAWINGS

FIG. 2 is a block diagram showing an example of the NAND flash memory shown in FIG. 1.

DETAILED DESCRIPTION

Figure 1:
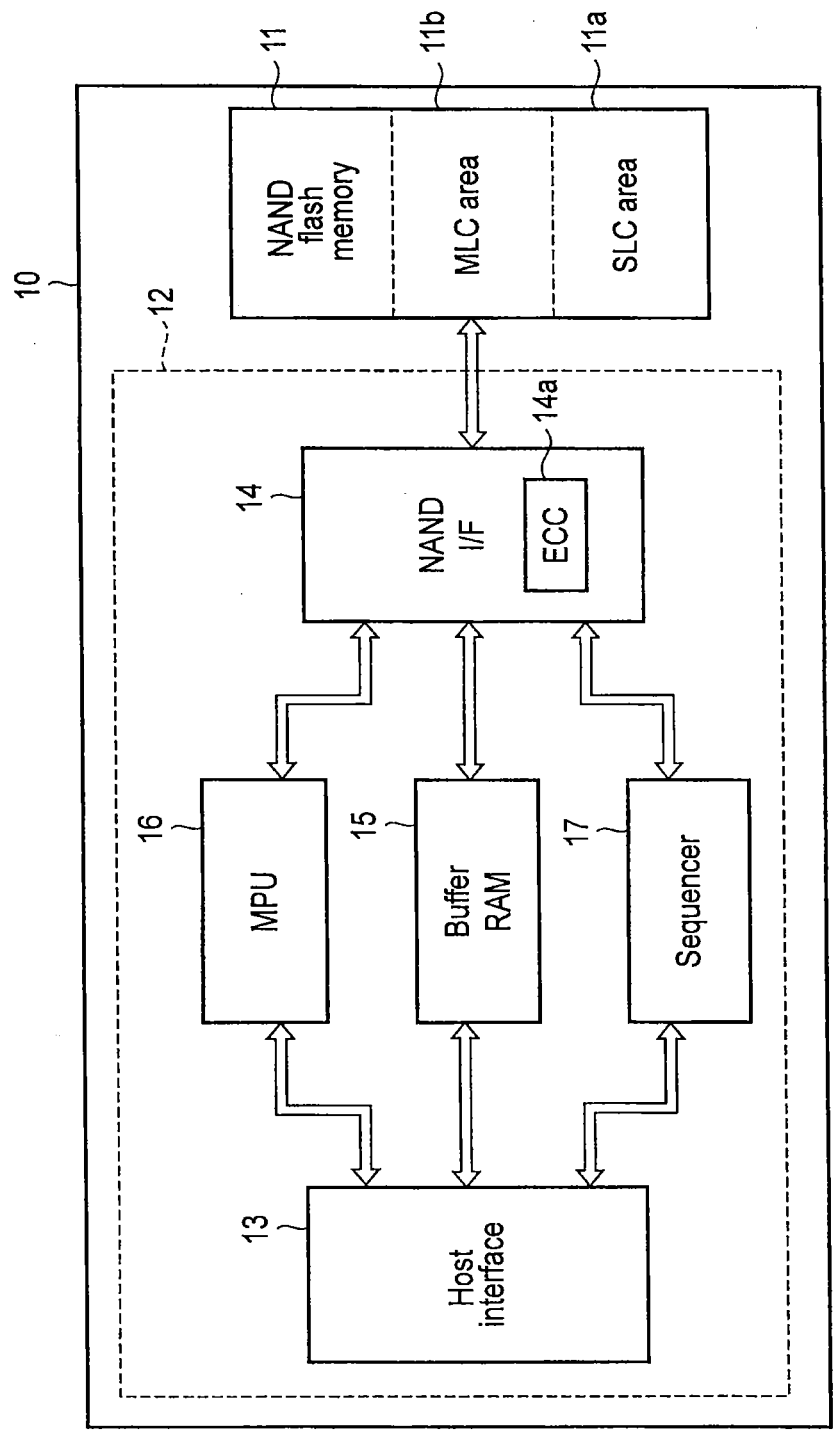
FIG. 1 is a block diagram showing a nonvolatile semiconductor memory system to which a first embodiment is applied.

In general, according to one embodiment, a memory system includes a memory cell array, first error correction part, second error correction part, and third error correction part. The memory cell array includes a first storage area in which 1-bit data is stored in one memory cell, and second storage area in which data of a plurality of bits is stored in one memory cell. Data is written to the memory cell array in units of pages, and is read from the memory cell array in units of pages. When data is written to the first storage area, the first error correction part generates first parity data in the row direction on the basis of the data. The second error correction part corrects an error of the data described above on the basis of the first parity data read from the memory cell array. The third error correction part generates second parity data in the column direction on the basis of data of a plurality of pages.

Recently, a NAND flash memory in which data of a plurality of bits (multilevel data) can be stored in one memory cell has been developed. This NAND flash memory includes a multilevel area (hereinafter referred to as an MLC area) in which, for example, data of a plurality of bits is stored in one memory cell, and single level area (hereinafter referred to as an SLC area) in which 1-bit data is stored in one memory cell. When data is to be written to the NAND flash memory, a management method in which, first, the data is temporarily written to the SLC area and, when the amount of the data in the SLC area reaches a unit of write to the MLC area, the data is copied from the SLC area to the MLC area is used.

That is, at the time of data write, the minimum size of data to be transferred from the host side is smaller than the data size for write to the MLC area. Accordingly, the data transferred from the host side is not directly written to the MLC area, and is temporarily written to the SLC area. In a state where the data size of the SLC area has reached the data size for write to the MLC area, the data in the SLC area is transferred to the MLC area. In this data transfer method, first, the data is written to the SLC area, and hence the data writing speed is high and, furthermore, the threshold distribution of data in the SLC area is wider than the MLC area, and the transfer method is therefore excellent in reliability of data.

When data is copied from the SLC area to the MLC area, data of three pages is read from the SLC area, and the data of three pages is written to memory cells of the MLC area to be selected by one word line. This operation is repeated for one block of the MLC area.

In this data transfer method, when all the pages in the SLC area are copied to the block of the MLC area, a redundant area of two pages is created in the block of the MLC area. More specifically, one block of the MLC area is constituted of 86 word lines and, data of, for example, three pages is written to one word line. Accordingly, one block of the MLC area is constituted of 258 pages (86×3=258). However, the write data is written in units of pages of exponentiated 2, e.g., in units of 256 pages. That is, data of 256 pages is written to the SLC area. Accordingly, a redundant area of two pages is created in one block of the MLC area. This redundant area is redundant pages created only in the MLC area, and hence the redundant area has not been particularly utilized.

Thus, in the first embodiment, parity data formed in the row direction for the data of the plurality of pages is stored in the redundant area, and the error correction capability of data read from the NAND flash memory is improved by using the parity data stored in the redundant area.

Hereinafter, embodiments will be described with reference to the drawings.

First Embodiment

FIG. 1 shows an example of a nonvolatile semiconductor memory system 10 to which a first embodiment is applied. This memory system 10 is constituted of a NAND flash memory 11, and memory controller 12 configured to control write and read of the NAND flash memory 11.

The NAND flash memory 11 includes an SLC area 11a in which 1-bit (binary) data is stored in one memory cell, and MLC area 11b in which data of a plurality of bits, for example, 3-bit (octal) data is stored in one memory cell. As described previously, when data is to be written to the NAND flash memory 11, first, the data is written to the SLC area 11a. When the amount of the data written to the SLC area 11a has reached the write unit of the MLC area, the data is copied from the SLC area to the MLC area.

The memory controller 12 is constituted of a host interface 13, NAND interface 14, buffer 15, micro-processing unit (MPU) 16, and sequencer 17.

The host interface 13 transfers data between a host device (not shown) and the buffer 15.

The NAND interface 14 transfers data between the NAND flash memory 11 and buffer 15. Furthermore, the NAND interface 14 includes an error correction section (ECC) 14a. When data is to be written to the NAND flash memory 11, the error correction section 14a generates parity data on the basis of the write data, adds the parity data to the write data and, when data is to be read from the NAND flash memory 11, the section 14a detects an error on the basis of the parity data added to the read data and, when an error is detected, executes error correction.

The buffer 15 is constituted of, for example, a random access memory (RAM), and is provided between the host interface 13 and NAND interface 14. The buffer 15 temporarily holds therein data to be written to the NAND flash memory 11, and data read from the NAND flash memory 11.

The MPU 16 carries out control of the whole nonvolatile semiconductor memory system 10.

The sequencer 17 controls, for example, read/write and the like of firmware stored in the NAND flash memory 11.

It should be noted that the memory controller 12 is not limited to the above-mentioned configuration, and can be modified and implemented. For example, it is also possible to provide, for example, a RAM serving as a work area of the MPU 16 or a ROM storing therein a program used to control the MPU 16.

FIG. 2 is a view showing an example of a memory cell array applied to the NAND flash memory 11.

The NAND flash memory 11 includes a plurality of blocks BLK0 to BLKn−1. The configurations of the blocks are identical to each other and, as shown in, for example, the block BLK0, each block includes a plurality of NAND cell units (NAND strings). Each of the NAND cell units is constituted of a plurality of memory cells M0 to M85 connected in series, a first selection transistor S1 connecting a drain of the memory cell M0 to a bit line BLe (BLo), and second selection transistor S2 connecting a source of the memory cell M31 to a source line SRC. A gate electrode of the first selection transistor S1 of each of the NAND cell units is connected to a first selection line SGD in a form of common connection, and gate electrode of the second selection transistor S2 is connected to a second selection line SGS. Gate electrodes of the memory cells M0, and M1 to M85 arranged on the same row are connected to word lines WL0, and WL1 to WL85, respectively.

Each of bit lines BLe arranged on even number columns is connected to a column selection transistor Te, and each of bit lines BLo is connected to a column selection transistor To. A column selection signal SELe is supplied to a gate electrode of each of the column selection transistors Te, and a column selection signal SELo is supplied to a gate electrode of each of the column selection transistors To. A pair of column selection transistors Te and To adjacent to each other is connected to one sense amplifier (SA) 11c. At the time of data read or data write, the bit line BLe or BLo selected by the column selection signal SELe or SELo is connected to the sense amplifier 11c.

Write or read of data to or from the memory cells M0, and M1 to M85 is executed for a plurality of memory cells connected to one word line selected by a row decoder 11d. In the case of this embodiment, when one bit is stored in one cell, data of one page is written to one word line and, when, for example, three bits are stored in one cell, data of three pages is written to one word line.

Processing such as write, read, copying operation, and the like for the memory cells is controlled by a control section 11e.

It should be noted that in the MLC area 11b, one block is constituted of, for example, 86 word lines and, for example, data of three pages is stored in each word line. That is, data of three bits is stored in one memory cell. Accordingly, one block is constituted of 258 pages (86×3=258).

Further, in the SLC area 11a, data of one page is stored in each word line. That is, 1-bit data is stored in one memory cell. Accordingly, one block is constituted of, for example, 86 pages.

Figure 3:
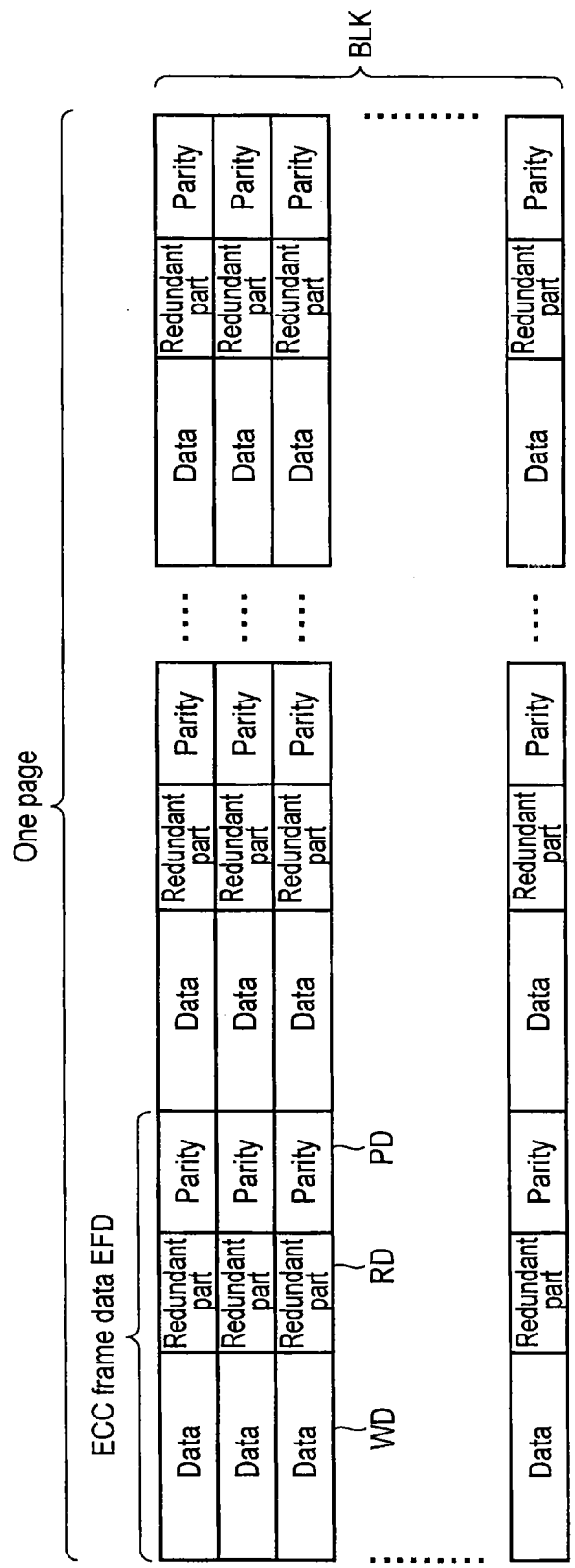
FIG. 3 is a view showing an example of page data in a block.

FIG. 3 shows an example of data to be written to the NAND flash memory 11.

Data of one page is constituted of a plurality of ECC frame data items EFD. Each of the ECC frame data items EFD is constituted of user write data WD, redundant part RD, and parity data PR. The parity data PR is generated on the basis of the write data WD, and data of the redundant part RD.

The page data PD configured as described above is stored in the SLC area 11a or the MLC area 11b.

Figure 4:
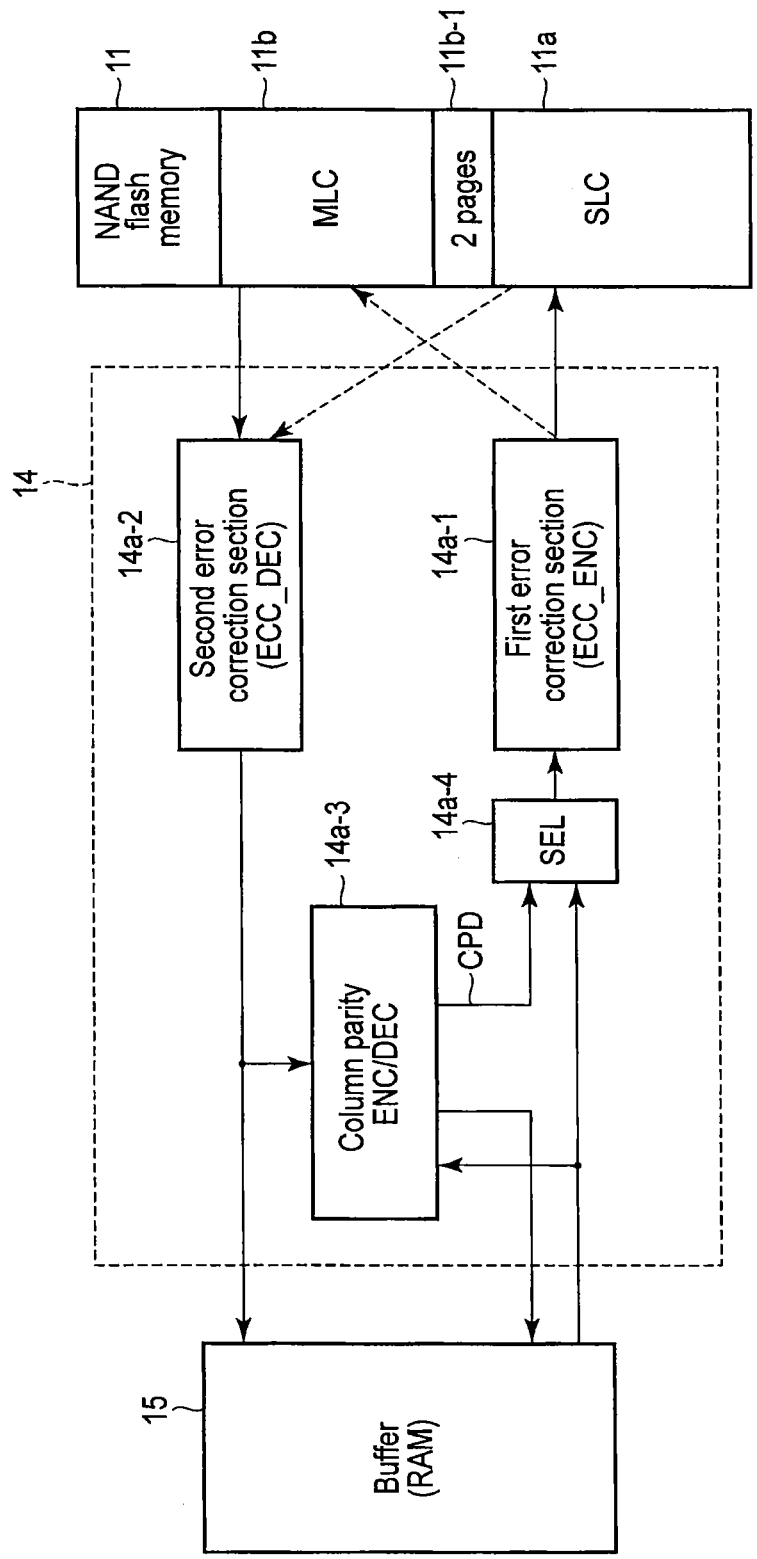
FIG. 4 is a block diagram showing part of FIG. 1 in an extracting manner.

FIG. 4 is a view specifically showing part of FIG. 1 and, shows, for example, the configuration of the NAND interface 14.

The NAND interface 14 is constituted of a first error correction section (ECC_ENC) 14a-1, second error correction section (ECC_DEC) 14a-2, column parity encoder/decoder (ENC/DEC) 14a-3, and selector (SEL) 14a-4.

Each of the first and second error correction sections 14a-1 and 14a-2 has a function used for carrying out general error correction processing in the row direction.

The first error correction section 14a-1 is a so-called ECC encoder and, when data is to be written to the NAND flash memory 11, generates parity data on the basis of the write data WD and data of the redundant part RD, and adds the parity data to the write data to thereby generate ECC frame data EFD, and page data PD.

The second error correction section 14a-2 is a so-called ECC decoder and, detects an error on the basis of the parity data added to data of one page read from the NAND flash memory 11 and, when an error is detected, corrects the error.

(Generation of Parity Data in the Column Direction)

When, for example, data in the SLC area 11a is to be copied to the MLC area 11b, the column parity encoder/decoder 14a-3 generates parity data (hereinafter referred to as column parity data) CPD in the column direction from data corresponding to one block of the MLC area 11b read from the SLC area 11a.

When data of the SLC area 11a is to be copied to the MLC area 11b, data of one page read from the SLC area 11a, and output through the second error correction section 14a-2 is supplied to the buffer 15, and is supplied to the column parity encoder/decoder 14a-3. The column parity encoder/decoder 14a-3 XORs the write data WD in the page data corresponding to one block of the MLC area 11b, and data of the redundant part RD in the column direction to generate column parity data CPD.

When data of the SLC area 11a is to be copied to the MLC area 11b, the page data corresponding to one block of the MLC area 11b stored in the buffer 15 is read in sequence, and is written to the MLC area 11b through the selector 14a-4, and first error correction section 14a-1. More specifically, data of three pages is written to one word line of the MLC area 11b. Accordingly, as described previously, a redundant area 11b-1 of two pages is created in one block of the MLC area. The column parity data CPD generated by the column parity encoder/decoder 14a-3 is stored in this redundant area 11b-1.

That is, the column parity data CPD generated by the column parity encoder/decoder 14a-3 is supplied to the first error correction section 14a-1 through the selector 14a-4. In the first error correction section 14a-1, parity data in the row direction is generated for the column parity data CPD, and the column parity data CPD is stored in the redundant area 11b-1 together with the parity data in the row direction.

Figure 5:
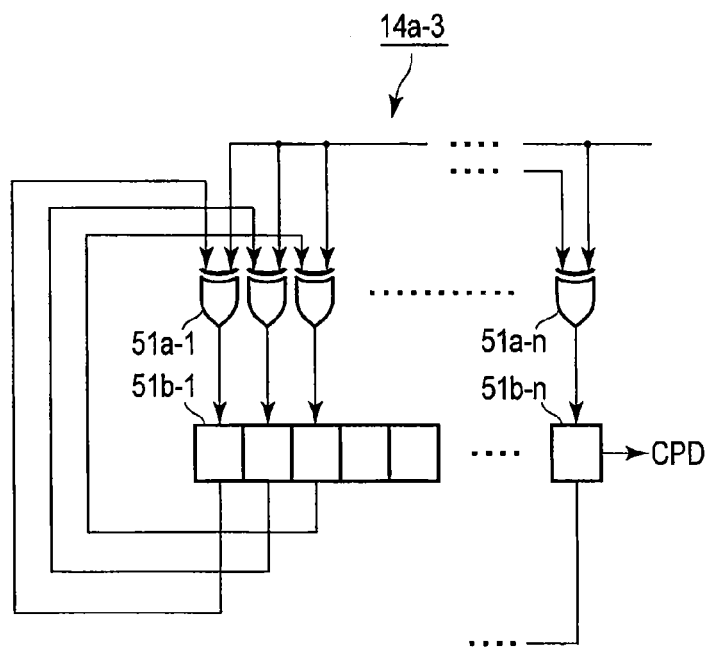
FIG. 5 is a circuit diagram showing an example of a parity data generation section in the column direction.

FIG. 5 shows an example of a column parity encoder/decoder 14a-3.

The column parity encoder/decoder 14a-3 is constituted of a plurality of EXOR circuits 51a-1 to 51a-n, and a plurality of registers 51b-1 to 51b-n. Each of the number of the EXOR circuits 51a-1 to 51a-n, and number of the plurality of registers 51b-1 to 51b-n is set to a number identical to the sum total of the number of bits of the write data WD in one page, and number of bits of the redundant part RD.

The data WD or data of the redundant part RG is input to one end of each of the EXOR circuits 51a-1 to 51a-n in a bit-by-bit manner (one bit at a time). An output end of each of the EXOR circuits 51a-1 to 51a-n is connected to an input end of each of the registers 51b-1 to 51b-n. An output end of each of the registers 51b-1 to 51b-n is connected to the other input end of corresponding one of the EXOR circuits 51a-1 to 51a-n. Accordingly, each of the EXOR circuits 51a-1 to 51a-n calculates an XOR of the data WD in one page, data of the redundant part RD, and data held in each of the registers 51b-1 to 51b-n, and holds a calculation result in each of the registers 51b-1 to 51b-n. As a result, column parity data generated from data corresponding to one block of the MLC area 11b read from the SLC area 11a is held in each of the registers 51b-1 to 51b-n.

Figure 6:
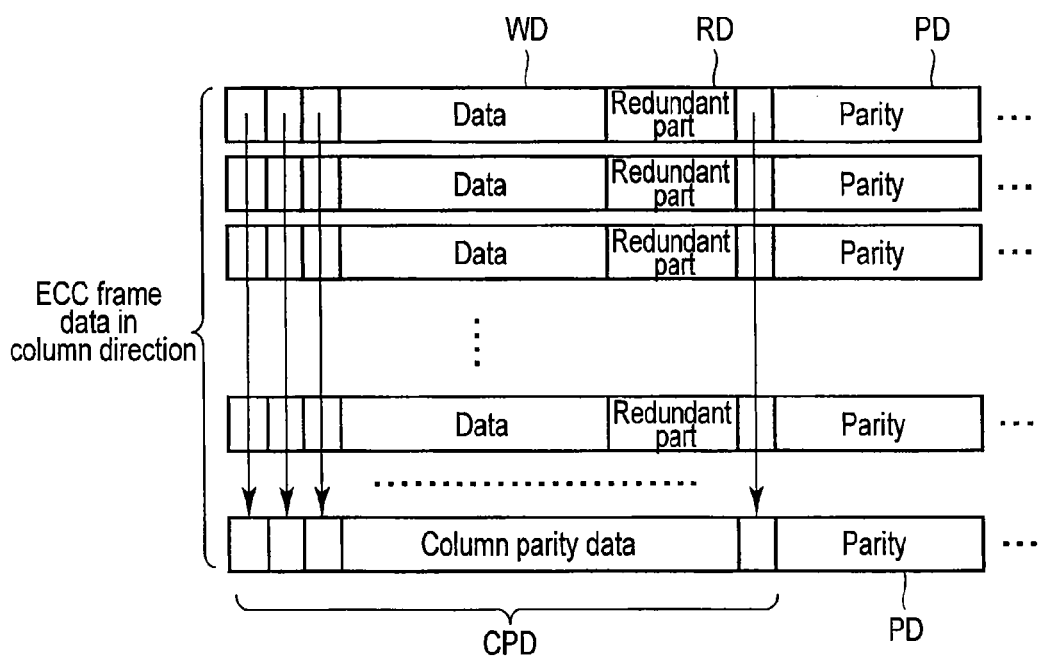
FIG. 6 is a view showing an example of parity data in the column direction.

FIG. 6 shows an example of an operation of the column parity encoder/decoder 14a-3. FIG. 6 shows a case where column parity data CPD is generated for each of ECC frame data items in a plurality of pages read from the SLC area 11a.

In this way, when data is to be copied from the SLC area 11a to the MLC area 11b, the column parity encoder/decoder 14a-3 generates column parity data CPD on the basis of the write data WD read from the SLC area 11a, and data of the redundant part RD.

When the column parity data CPD is to be written to the redundant area 11b-1 of the MLC area 11b, parity data PD in the row direction is generated by the first error correction circuit 14a-1. That is, the first error correction circuit 14a-1 generates the parity data PD in the row direction on the basis of the column parity data CPD. The parity data PD in the row direction, and column parity data CPD are written to the redundant area 11b-1 of the MLC area 11b.

(Decoding of Column Parity Data)

On the other hand, when data stored in the MLC area 11b is read, data of a specified page size is read from the MLC area 11b. The read data is subjected to error detection by the second error correction section 14a-2. That is, the second error correction section 14a-2 detects an error on the basis of the parity data in the row direction added to the read data, and corrects the detected error.

When the error cannot be corrected by the second error correction section 14a-2, the column parity data CPD written to the redundant area 11b-1 of the MLC area 11b is read, and correction processing is executed by using the column parity data PCD.

Figure 7:
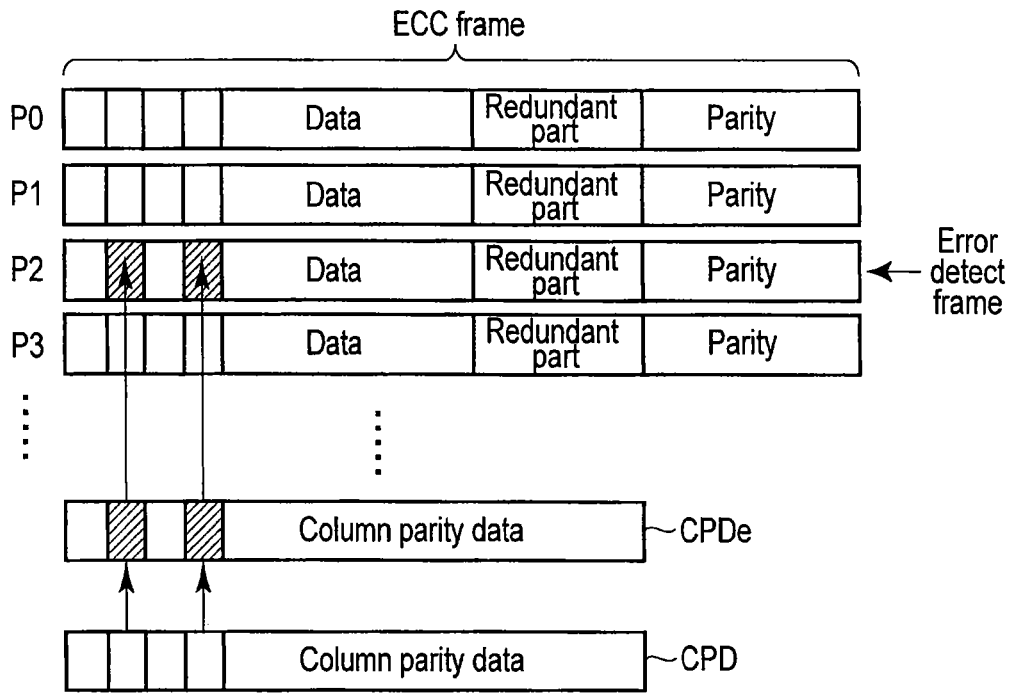
FIG. 7 is a view showing an example of an error correction operation of the first embodiment.

FIG. 7 shows an example of the correction processing. In this embodiment, error correction is enabled on the premise that an error occurs in one page of a plurality pages in the block, and no error occurs in other pages. That is, it is possible to determine a page in which an error is detected by means of the second error correction section 14a-2. FIG. 7 shows a case where errors occur in two columns of a page P2.

Further, it is possible to detect a position of a column at which an error occurs by comparing the column parity data CPD stored in the redundant area 11b-1, and column parity data CPDe generated from each page including an error with each other. That is, in the column parity data CPDe, data of a column in which an error occurs differs from data of the same column of the column parity data CPD. Accordingly, it is possible to detect a column in which an error occurs by comparing the column parity data CPDe, and column parity data CPD with each other. By inverting the data of the column in which the error occurs, the error can be corrected.

Figure 8:
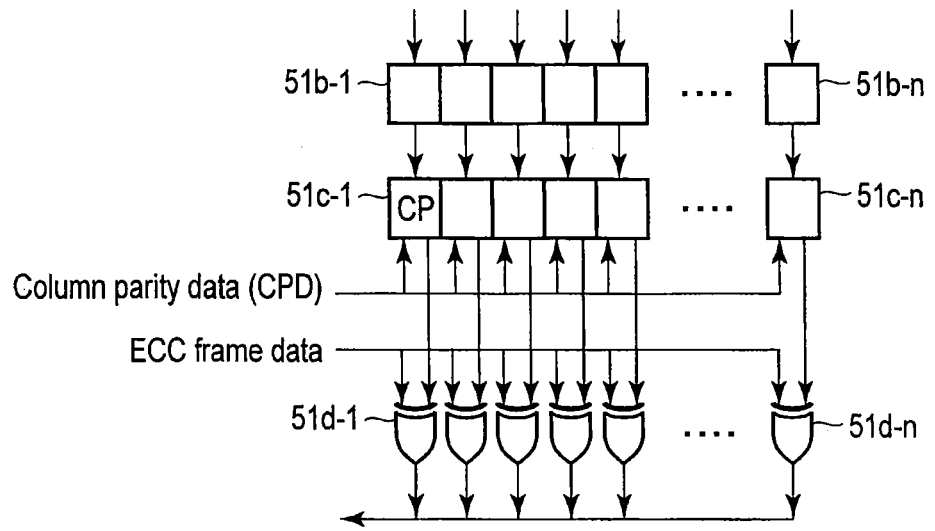
FIG. 8 is a view showing an example of an error correction circuit of the first embodiment.

FIG. 8 shows an example of an error correction circuit, and parts identical to FIG. 5 are denoted by identical reference symbols.

In FIG. 8, an output end of each of registers 51b-1 to 51b-n is connected to one input end of each of comparators 51c-1 to 51c-n. Column parity data CPDe including an error is output from each of the registers 51b-1 to 51b-n. Column parity data CPD is supplied from the buffer 15 to the other input end of each of the comparators 51c-1 to 51c-n. Each of the comparators 51c-1 to 51c-n compares the column parity data CPDe, and column parity data CPD with each other to detect a column in which an error occurs.

It should be noted that it is not necessary to carry out the comparison operation for one page and, it is sufficient if the comparison operation is carried out only for an ECC frame including an uncorrectable error.

An output end of each of the comparators 51c-1 to 51c-n is connected to one input end of each of the EXOR circuits 51d-1 to 51d-n. ECC frame data of a page including an error read from the buffer 15 is supplied to the other input end of each of the EXOR circuits 51d-1 to 51d-n. Each of the EXOR circuits 51d-1 to 51d-n inverts data of a column in which an error occurs on the basis of output data of each of the comparators 51c-1 to 51c-n to thereby correct the error. An output end of each of the EXOR circuits 51d-1 to 51d-n is connected to the buffer 15 shown in FIG. 4.

Correction processing will be specifically described with reference to FIG. 8.

When an error is detected, one block of the ECC frame of the other page corresponding to the ECC frame in which the error is detected is read in sequence. The read ECC frame data is stored in the buffer 15, and is supplied to the column parity encoder/decoder 14a-3. At this time, the column parity data CPD in the redundant area 11b-1 is not read.

The column parity encoder/decoder 14a-3 carries out calculation identical to the generation of the column parity data CPD with respect to the read ECC frame data corresponding to one block. That is, the column parity encoder/decoder 14a-3 carries out an EXCLUSIVE-OR operation of data of a column identical to the ECC frame data corresponding to one block by using the EXOR circuits 51a-1 to 51a-n, and registers 51b-1 to 51b-n to thereby generate column parity data CPDe in each of the registers 51b-1 to 51b-n.

After the calculation of the column parity data CPDe is completed, the column parity data CPD is read from the redundant area 11b-1 of the MLC area 11b, and is compared with the column parity data CPDe in each of the registers 51b-1 to 51b-n. That is, the column parity data CPD read from the redundant area 11b-1 is supplied to each of the comparators 51c-1 to 51c-n through the buffer 15. Each of the comparators 51c-1 to 51c-n compares the column parity data CPDe in each of the registers 51b-1 to 51b-n, and column parity data CPD read from the redundant area 11b-1 with each other. As a result, for example, data "1" is output from a comparator in which a mismatch is detected and, for example, data "0" is output from a comparator in which a coincidence is detected.

Output data of each of the comparators 51c-1 to 51c-n is supplied to one input end of, for example, each of the EXOR circuits 51d-1 to 51d-n serving as correction circuits. ECC frame data of a page including an error read from the buffer 15 is supplied to the other input end of each of the EXOR circuits 51d-1 to 51d-n. Each of the EXOR circuits 51d-1 to 51d-n inverts data of a column in which an error occurs on the basis of the output data of each of the comparators 51c-1 to 51c-n to correct the error. The ECC frame data in which errors are corrected is written to a corresponding page of the buffer 15.

It should be noted that the operation of copying data from the SLC area 11a to the MLC area 11b has been carried out through the memory controller 12. However, the operation is not limited to this and, it is also possible to apply, for example, a direct copying operation of transferring data from the SLC area 11a to the MLC area 11b in the NAND flash memory 11.

In the case of the direct copying operation, it is sufficient if column parity data CPD is generated by the column parity encoder/decoder 14a-3 from data read from the SLC area 11a, and the column parity data CPD is written to the redundant area 11b-1 of the MLC area 11b.

It should be noted that the error correction circuit is not limited to the configuration shown in FIG. 8. In the case of this embodiment, when the column parity data CPD read from the redundant area 11b-1, and column parity data CPDe generated from each page are EXORed, if there is no error, an all "0" state is obtained and, if there is an error, data of a column in which an error occurs becomes "1", and the all "0" state is not obtained. By employing such a configuration, it is possible to detect a column in which an error occurs, and by inverting the data of the column, the error can be corrected.

According to the first embodiment, when data is copied from the SLC area 11a to the MLC area 11b, the column parity data CPD is generated from data corresponding to one block of the MLC area 11b. Accordingly, in reading data from the MLC area 11b, even when it is not possible to correct an error by using the parity data in the row direction added to each page, it is possible to correct an error in the column direction by using the column parity data CPD. Accordingly, it is possible to improve the error correction capability.

Further, the column parity data CPD is written to the redundant area 11b-1 of the MLC area 11b. Accordingly, a dedicated storage area is not needed, and it is not necessary to reduce the memory area in order to improve the error correction capability.

Furthermore, the first error correction section 14a-1 generates parity data in the row direction on the basis of the column parity data CPD generated by the column parity encoder/decoder 14a-3, and the column parity data PCD is written to the redundant area 11b-1 of the MLC area 11b with the parity data in the row direction added thereto. Therefore, it is possible to improve the reliability of the column parity data CPD itself.

Second Embodiment

In the first embodiment described above, the column parity data CPD has been generated for data of one block copied to the MLC area 11b. The reason for this is that, as described previously, the correction processing is based on the premise that an error occurs in one page in one block. Therefore, when errors occur in a plurality of pages in one block, it becomes difficult to correct the errors.

Thus, in a second embodiment, one block is divided into a plurality of sub-blocks, and column parity data CPD is generated for each of the sub-blocks, whereby, even when errors are detected in a plurality of pages in one block, it is made possible to correct the errors.

Figure 9:
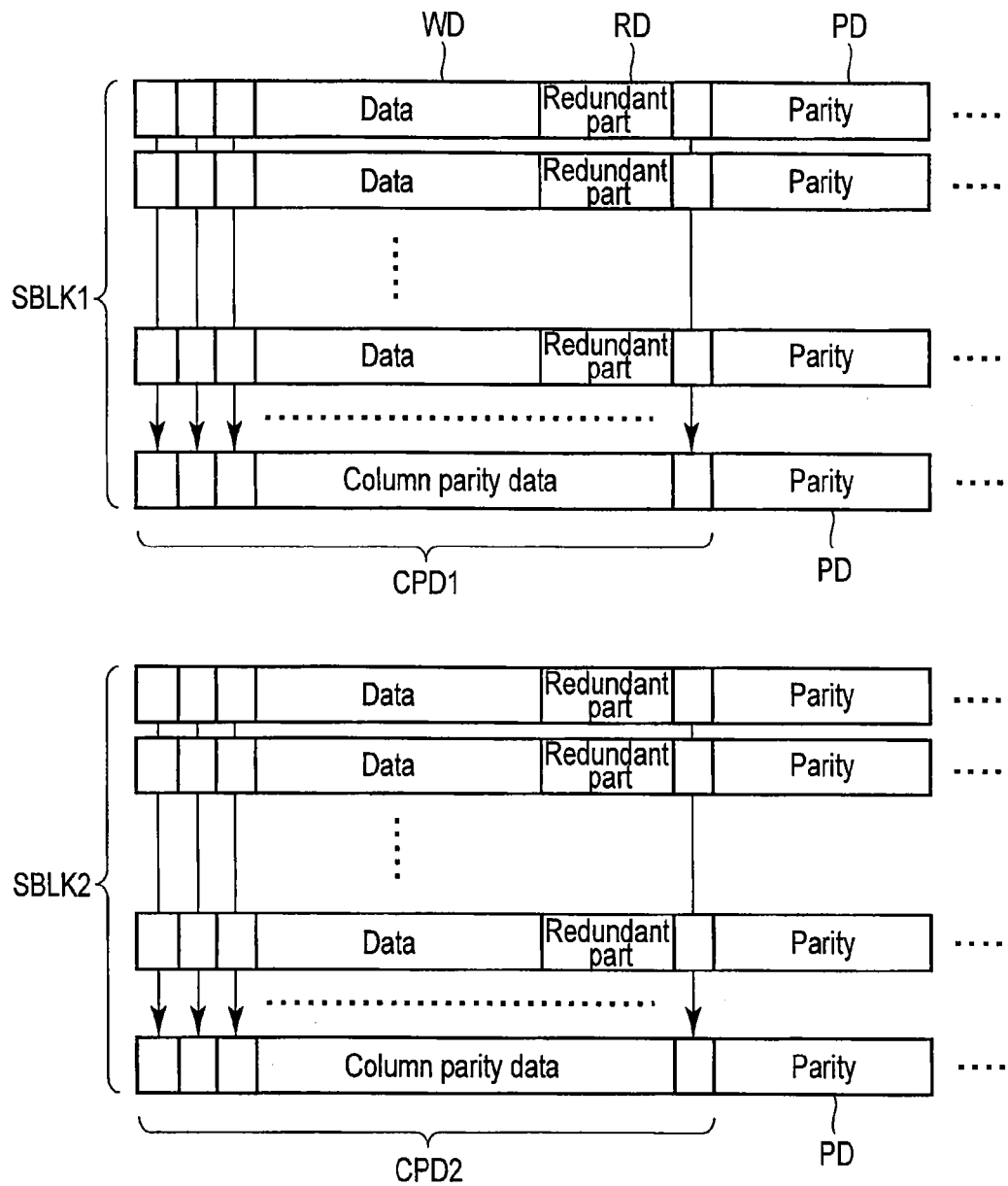
FIG. 9 is a view showing an example of parity data in the column direction according to a second embodiment.

FIG. 9 is a view showing the second embodiment. In FIG. 9, one block is divided into, for example, two sub-blocks SBLK1 and SBLK2, and column parity data CPD1 or CPD2 is generated for each of the sub-blocks SBLK1 and SBLK2. That is, the column parity data CPD1 or CPD2 is generated every 129 pages. Generation of the column parity data CPD1 or CPD2 is identical to the first embodiment.

According to the second embodiment, the column parity data CPD1 or CPD2 is generated for each of the two sub-blocks. Accordingly, when an error is detected in one page in each of the sub-blocks SBLK1 and SBLK2, it is possible to correct these errors. Accordingly, the probability of being able to correct errors in two pages for one block is enhanced, and hence, as a result, it is possible to improve the error correction capability.

Further, when the number of sub-blocks in one block is increased and, column parity data is generated, for example, every four sub-blocks, it is possible to further enhance the probability of being able to correct errors occurring in a plurality of pages in the block.

Further, by generating column parity data CPD1 or CPD2 for each of sub-blocks smaller than one block, when an error is detected at the time of data read, it is possible to shorten the time needed to generate column parity data CPDe from the ECC frame including an error, and achieve a speedup of the correction processing.

Furthermore, it is possible to write the two column parity data items CPD to the redundant area 11b-1 (two pages) of the MLC area 11b. Accordingly, a dedicated storage area is not needed, and it is not necessary to reduce the memory area in order to improve the error correction capability.

Third Embodiment

In each of the first and second embodiments, a case where an uncorrectable error is included in one page or in two pages has been described.

Conversely, in a third embodiment, a correction operation to be carried out when uncorrectable errors are detected in two or more frames throughout, for example, read data of several pages will be described.

For example, in the case where the ECC in units of pages is implemented by the ECC (e.g., LDPC) of the soft-decision system, when LDPC error correction fails in two pages, and a parity error occurs in a certain column, it is not possible to determine in which of the two pages the error has occurred. In this case, the likelihood ratio between bits of column addresses of the two pages in which the parity error occurs is made "0" to thereby set a bit-lost-state and, thereafter LDPC error correction is executed again for the two pages in units of pages. Thereby, practical correction capability is improved.

Fourth Embodiment

In the first embodiment, the column parity data is generated when data stored in the SLC area 11a is transferred to the MLC area 11b. Conversely, in a fourth embodiment, column parity data is generated while data is written from the host device to a NAND flash memory 11.

That is, in the case where data to be written to an SLC area 11a is data greater than one block of an MLC area 11b, when data corresponding to one block is written to the SLC area 11a, it is possible to generate column parity data.

More specifically, data output from the host device is written to the SLC area 11a of the NAND flash memory 11 through a buffer 15, selector 14a-4, and first error correction section 14a-1 as shown in FIG. 4. Simultaneously with this, the data output from the buffer 15 is supplied to a column parity encoder/decoder 14a-3, and column parity data is generated.

The above operation is repeated and, when data corresponding to one block has been written to the SLC area 11a, the data in the SLC area 11a is transferred to the MLC area 11b. In order to carry out this transfer operation, it is sufficient if the data is directly transferred from the SLC area 11a to the MLC area 11b in the NAND flash memory 11.

After this, column parity data CPD generated in each of registers 51b-1 to 51b-n of the column parity encoder/decoder 14a-3 shown in FIG. 5 is written to a redundant area 11b-1 of the MLC area 11b through the selector 14a-4, and first error correction section 14a-1.

Subsequently, the data supplied from the host device is written to the SLC area 11a of the NAND flash memory 11 in the same manner as described above and, at the same time, column parity data CPD is generated.

According to the fourth embodiment described above, while the data is written to the SLC area 11a of the NAND flash memory 11, the column parity data CPD is generated. Accordingly, when data in the SLC area 11a is to be transferred to the MLC area 11b, it is not necessary to generate column parity data CPD. Therefore, it is possible to shorten the time required when data is transferred from the SLC area 11a to the MLC area 11b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory cell array which includes a first storage area configured to store therein 1-bit data in one memory cell, and a second storage area configured to store therein data of a plurality of bits in one memory cell, to which the data is written in units of pages, and from which the data is read in units of pages, the second storage area including a plurality of blocks each of which is constituted of a plurality of pares, each of the plurality of blocks including an area configured to store therein data of the first storage area, and a redundant area including a page;
a first error correction part configured to generate first parity data in a row direction on the basis of the data, when the data is written to the first storage area;
a second error correction part configured to correct an error of the data on the basis of the first parity data read from the memory cell array; and
a third error correction part configured to generate second parity data in a column direction on the basis of data of a plurality of pages,
wherein the third error correction part generates the second parity data, when the data of the plurality of pages stored in the first storage area is transferred to the second storage area,
the second parity data is stored in the redundant area of the second storage area,
the second error correction part corrects an error of the data of the plurality of pages read from the second storage area on the basis of the first parity data, and
the third error correction part corrects an error of the data of the plurality of pages read from the second storage area on the basis of the second parity data, when the error cannot be corrected by the second error correction part.

2. The system according to claim 1, wherein
the third error correction part generates the second parity data for each of the blocks.

3. The system according to claim 1, wherein
each of the plurality of blocks includes a plurality of sub-blocks, and the third error correction part generates the second parity data for each of the plurality of sub-blocks.

4. The system according to claim 1, wherein
the third error correction part generates third parity data in the column direction on the basis of the data of the plurality of pages, compares the third parity data, and the second parity data with each other to detect an error column, and corrects data of the detected error column.

5. The system according to claim 4, wherein
the third error correction part comprises:
a plurality of EXOR circuits each of which includes first and second input ends, and an output end, and in each of which the data of each column of the data is supplied to the first input end; and
a plurality of registers each of which includes an input end, and an output end, and in each of which the input end is connected to the output end of corresponding one of the plurality of EXOR circuits, and the output end is connected to the second input end of the corresponding one of the plurality of EXOR circuits.

6. The system according to claim 5, wherein
the third error correction part further comprises:
a plurality of comparators each of which includes first and second input ends, and an output end, and in each of which the output end of corresponding one of the plurality of registers is connected to the first input end, and the second parity data is supplied to the second input end; and
a plurality of correction circuits each of which includes first and second input ends, and an output end, and in each of which the first input end is connected to the output end of corresponding one of the plurality of comparators, and data including an error is supplied to the second input end,
wherein when an error cannot be corrected by the second error correction part, each of the plurality of comparators compares the third parity data supplied from each of the plurality of registers, and the second parity data with each other to detect an error column, and each of the plurality of correction circuits corrects the data of the detected error column.

7. An error correction method of a memory system comprising a memory cell array which includes a first storage area configured to store therein 1-bit data in one memory cell, and a second storage area configured to store therein data of a plurality of bits in one memory cell, to which the data is written in units of pages, and from which the data is read in units of pages, the second storage area including a plurality of blocks each of which is constituted of a plurality of pages, each of the plurality of blocks including an area configured to store therein data of the first storage area, and a redundant area including a page, the method comprising:

generating, when data is written to the first storage area first parity data in a row direction on the basis of the data;

generating, when data stored in the first storage area is transferred to the second storage area, second parity data in a column direction on the basis of data of a plurality of pages read from the first storage area;

storing the second parity data in the redundant area of the second storage area;

correcting an error of data read from the second storage area in units of pages on the basis of the first parity data; and correcting an error of the data of the plurality of pages read from the second storage area on the basis of the second parity data, when the error cannot be corrected by the first parity data.

8. The method according to claim 7, further comprising:

generating third parity data in the column direction on the basis of the data of the plurality of pages of the second storage area;

comparing the second parity data, and the third parity data with each other to detect an error column; and correcting the data of the detected error column.

9. The method according to claim 7, wherein
the second parity data is generated for each of the blocks.

10. The method according to claim 7, wherein
each of the plurality of blocks includes a plurality of sub-blocks, and the second parity data is generated for each of the plurality of sub-blocks.

* * * * *